United States Patent
Beyne et al.

(10) Patent No.: US 10,332,850 B2
(45) Date of Patent: Jun. 25, 2019

(54) METHOD FOR PRODUCING CONTACT AREAS ON A SEMICONDUCTOR SUBSTRATE

(71) Applicant: IMEC, Leuven (BE)

(72) Inventors: Eric Beyne, Leuven (BE); Wenqi Zhang, Leuven (BE); Geraldine Jamieson, Balen (BE); Bart Swinnen, Holsbeek (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/313,664

(22) Filed: Jun. 24, 2014

(65) Prior Publication Data

US 2014/0374919 A1 Dec. 25, 2014

(30) Foreign Application Priority Data

Jun. 24, 2013 (EP) ..................................... 13173335

(51) Int. Cl.
*H01L 23/00* (2006.01)
*H01L 23/498* (2006.01)
*H01L 21/48* (2006.01)

(52) U.S. Cl.
CPC .......... *H01L 24/06* (2013.01); *H01L 21/4853* (2013.01); *H01L 23/49811* (2013.01);
(Continued)

(58) Field of Classification Search
CPC .............. H01L 24/06; H01J 2237/3382; H01J 2237/334–2237/3348
See application file for complete search history.

(56) References Cited

U.S. PATENT DOCUMENTS

| 4,522,681 A | 6/1985 | Gorowitz et al. |
| 4,671,849 A | 6/1987 | Chen et al. |

(Continued)

FOREIGN PATENT DOCUMENTS

| EP | 0050972 A2 | 5/1982 |
| EP | 0282820 A1 | 3/1988 |

(Continued)

OTHER PUBLICATIONS

European Search Report, European Patent Application No. 13173335.4, dated Jan. 8, 2014.

*Primary Examiner* — William F Kraig
*Assistant Examiner* — Khatib A Rahman
(74) *Attorney, Agent, or Firm* — McDonnell Boehnen Hulbert & Berghoff LLP

(57) ABSTRACT

Provided herein is a method for producing hollow contact areas for insertion bonding, formed on a semiconductor substrate comprising a stack of one or more metallization layers on a surface of the substrate. Openings are etched in a dielectric layer by plasma etching, using a resist layer as a mask. The resist layer and plasma etch parameters are chosen to obtain openings with sloped sidewalls having a pre-defined slope, due to controlled formation of a polymer layer forming on the sidewalls of the resist hole and the hollow contact opening formed during etching. According to a preferred embodiment, metal deposited in the hollow contact areas and on top of the dielectric layer is planarized using chemical mechanical polishing, leading to mutually isolated contact areas. The disclosure is also related to components obtainable by the method and to a semiconductor package comprising such components.

14 Claims, 3 Drawing Sheets

(52) U.S. Cl.
CPC ........ *H01L 24/03* (2013.01); *H01J 2237/334* (2013.01); *H01J 2237/338* (2013.01); *H01J 2237/3342* (2013.01); *H01J 2237/3347* (2013.01); *H01J 2237/3348* (2013.01); *H01J 2237/3382* (2013.01); *H01L 2224/03466* (2013.01); *H01L 2224/0401* (2013.01); *H01L 2224/0601* (2013.01); *H01L 2224/16237* (2013.01)

(56) References Cited

U.S. PATENT DOCUMENTS

| | | | |
|---|---|---|---|
| 4,814,041 | A | 3/1989 | Auda |
| 4,978,420 | A | 12/1990 | Bach |
| 5,970,376 | A * | 10/1999 | Chen ................ H01L 21/02063 134/1.1 |
| 5,985,521 | A * | 11/1999 | Hirano ................. H01L 21/486 205/125 |
| 6,040,247 | A | 3/2000 | Chung |
| 6,136,694 | A * | 10/2000 | Ho ......................... G03F 7/425 257/E21.252 |
| 6,214,716 | B1 | 4/2001 | Akram |
| 6,335,275 | B1 | 1/2002 | Yabata et al. |
| 6,458,430 | B1 * | 10/2002 | Bernstein ............. C23C 14/042 257/E21.143 |
| 6,559,048 | B1 | 5/2003 | Kim et al. |
| 2003/0232486 | A1 * | 12/2003 | Mashino ............... H01L 23/481 438/455 |
| 2005/0148180 | A1 | 7/2005 | Sivakumar et al. |
| 2005/0263899 | A1 | 12/2005 | Sivakumar et al. |
| 2010/0320575 | A9 * | 12/2010 | Chauhan ............... H01L 23/481 257/621 |
| 2011/0027967 | A1 * | 2/2011 | Beyne ..................... H01L 24/11 438/455 |
| 2013/0011938 | A1 * | 1/2013 | Tsao ........................ H01L 22/12 438/8 |
| 2013/0049220 | A1 * | 2/2013 | Hsieh ................ H01L 21/76898 257/774 |
| 2013/0334607 | A1 * | 12/2013 | Fumitake .......... H01L 21/76229 257/368 |
| 2013/0344699 | A1 * | 12/2013 | Chiba ............... H01L 21/02118 438/700 |
| 2014/0042122 | A1 * | 2/2014 | Jung .................... H05K 3/0079 216/18 |
| 2014/0083458 | A1 * | 3/2014 | Fuchigami ........ H01L 21/31133 134/12 |

FOREIGN PATENT DOCUMENTS

| | | |
|---|---|---|
| EP | 0871213 A2 | 10/1998 |
| EP | 2273545 A1 | 1/2011 |
| JP | 57-136327 | 8/1982 |
| JP | 59-35451 | 2/1984 |
| JP | 59-172234 | 9/1984 |
| JP | 7-335625 | 12/1995 |
| JP | 2005005397 | 1/2005 |
| JP | 2008147317 | 6/2008 |
| TW | 411581 B | 11/2000 |

* cited by examiner

METHOD FOR PRODUCING CONTACT AREAS ON A SEMICONDUCTOR SUBSTRATE

CROSS REFERENCE TO RELATED APPLICATION

The present disclosure claims priority to EP 13173335.4, filed at the European Patent Office on Jun. 24, 2013, the entire contents of which are herein incorporated by reference.

TECHNICAL FIELD

The present disclosure is related to semiconductor packaging, in particular to a method for producing contact areas suitable for bonding semiconductor components together by insertion bonding.

BACKGROUND

Unless otherwise indicated herein, the materials described in this section are not prior art to the claims in this application and are not admitted to be prior art by inclusion in this section.

Insertion bonding is a technique whereby an electrical connection is formed between two components, e.g. between an integrated circuit and a carrier substrate. One of the components is provided with protruding contact structures, in the form of copper-based microbumps or so-called Through Silicon Vias (TSV). On the other component, a set of hollow contact areas is produced for receiving the bumps or TSVs. The contact areas are formed as cavities, lined with a metal layer and suitable for forming a connection with the metal of the bump or TSV, when the latter is brought into contact with the cavity under a given pressure.

The cavities are preferably provided with sloped sidewalls, so as to increase the accessibility of the cavity. A standard method for producing arrays of such cavities configured to receive an array of bumps or TSVs is to produce the cavities in a dielectric layer produced on top of a metallization layer, by a suitable etching technique, depositing a conformal metal layer (for example a stack of Ta and Cu), and removing the metal layer from the areas between the cavities by a litho/etch step, so as to isolate the cavities from each other. As a portion of the metal layer remains on the surface immediately surrounding the cavities, this technique makes it difficult to produce arrays with very small pitch (distance between corresponding points of two adjacent cavities, e.g. between two adjacent cavity center lines).

The currently known methods for producing the sloped sidewall surface of the cavities are also problematic. The standard etching technique used for creating these cavities utilizes an etching mask with openings that are smaller than the eventual top section of the cavities, taking into account a widening of the upper diameter of the openings due to underetching around the circumference of the mask openings when using a hardmask, or by the pull-back effect when using a resist as the mask (due to etching of the mask itself). This widening effect must be taken into account in the design of the etch mask, and represents another obstacle for producing fine-pitched arrays of cavities. Another method is shown in document US2005148180, where a resist layer is applied on top of a dielectric layer into which the cavities are to be produced, the resist layer being subsequently provided with openings, and heat treated to form sloped sidewalls in the openings. These sloped sidewalls are then transferred to the underlying layer by a suitable etching technique. This method however requires the additional heating step during which the slope of the openings is difficult to control. Especially when the height of the contact structures on the other component fluctuates significantly, this causes problems during the contacting process.

SUMMARY

This disclosure is related to a method and to a semiconductor component and package as described in the appended claims. The disclosure is firstly related to a method for producing hollow contact areas suitable for insertion bonding, formed on a semiconductor substrate comprising a stack of one or more metallization layers on a surface of the semiconductor substrate. Openings are etched in a dielectric layer by plasma etching, using a resist layer as a mask. The resist layer and the plasma etch parameters are chosen so as to obtain openings with sloped sidewalls that have a pre-defined slope, due to the controlled formation of a polymer layer on the sidewalls of the resist hole and the hollow contact opening formed during the etch step. According to a preferred embodiment, metal deposited in the hollow contact areas and on top of the dielectric layer is planarized using chemical mechanical polishing, leading to mutually isolated contact areas. With this method an array of such hollow contact areas can be produced having smaller pitch compared to other arrays. The disclosure is equally related to components obtainable by the disclosed method and to a package comprising such components.

The disclosure is in particular related to a method for producing hollow contact areas on a semiconductor component comprising a stack of one or more metallization layers on a semiconductor substrate. The method includes depositing a dielectric layer on and in contact with one or more metal areas of an upper metallization layer of the stack and depositing a resist layer on and in contact with the dielectric layer. The method further includes producing one or more openings in the resist layer, the openings being located above the one or more metal areas, thereby exposing areas of the dielectric layer. The method further includes removing the dielectric layer in the areas of the dielectric layer, thereby forming openings in the dielectric layer and exposing at the bottom of the openings at least portions of the metal areas. The method further includes stripping the resist layer and depositing a metal layer conformally on the dielectric layer and in the openings in the dielectric layer The method further includes removing the metal layer from at least a portion of a flat upper surface of the dielectric layer, a metal layer remaining on the bottom and side walls of the openings in the dielectric layer. The openings in the resist layer have substantially vertical sidewalls and the openings in the dielectric layer are produced by plasma etching. The resist layer and the plasma process are configured so that substantially no outgassing occurs during the formation of the openings in the dielectric layer, a polymer layer is continuously formed on the sidewalls of the resist layer openings and on the sidewalls of the openings in the dielectric layer, as the openings are being etched, so that the openings in the dielectric layer have sloped sidewalls, the slope of the walls being substantially pre-defined, the polymer layer being removed during the resist stripping step.

According to specific embodiments, the resist layer is a plating resist layer or a DNQ resist layer respectively.

According to an embodiment, the upper cross section of the openings in the dielectric layer, obtained after stripping the resist and the polymer layer, is substantially equal to the cross section of the openings in the resist layer.

According to an embodiment, the thickness of the resist layer is at least 5 µm.

According to an embodiment, at least a portion of the openings in the dielectric layer are produced as an array of openings with a pitch between 3 and 10 µm.

According to a further embodiment, the step of removing the metal layer is performed by chemical mechanical polishing. In this case, the method may further comprise the step of depositing a solder material on the metal layer in the openings made in the dielectric layer, before or after performing CMP.

The disclosure is equally related to a semiconductor component comprising an array of hollow contact areas having sloped sidewalls, in a dielectric layer, with a metal contact layer lining the surface of the hollow contact areas, the slope angles of the respective sidewalls of any two of the contact areas of the array being substantially equal. The pitch of the array may be between 3 and 10 µm.

According to an embodiment of the component according to the disclosure, the metal layer does not extend onto a flat upper surface of the dielectric layer.

A semiconductor component according to the disclosure may comprise a solder material on the metal contact layer.

The disclosure is equally related to a semiconductor package comprising a first semiconductor component according to the disclosure and a second semiconductor component provided with contact structures bonded to the hollow contact areas of the first semiconductor component by insertion bonding.

These as well as other aspects, advantages, and alternatives will become apparent to those of ordinary skill in the art by reading the following detailed description, with reference where appropriate to the accompanying figures.

DETAILED DESCRIPTION

Figure 1A:
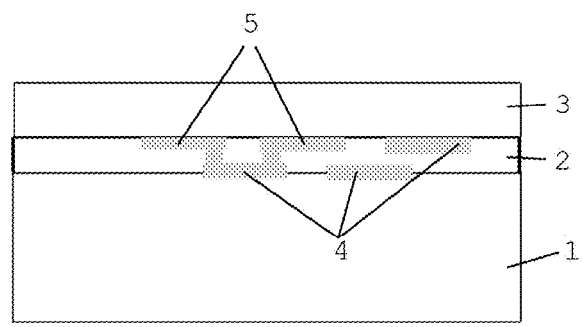
FIGS. 1a, 1b, 1c, 1d, 1e, and 1f illustrate a method according to a first aspect of the disclosure.
Figure 1B:
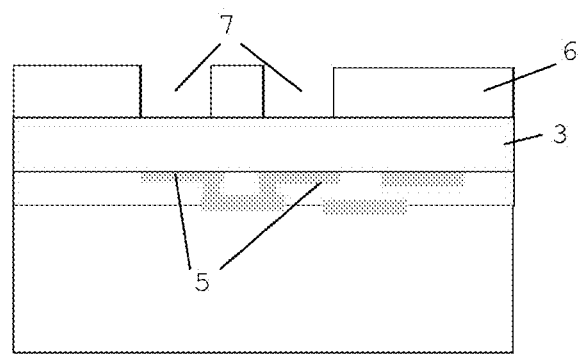

FIGS. 1a-1f illustrate a method according to a first aspect of the disclosure. A substrate 1 is provided (FIG. 1a), comprising an upper metallization layer 2, and a dielectric layer 3 on and in contact with the metallization layer 2. The substrate 1 may be a silicon carrier wafer comprising further metallization layers (M1 and M2 etc.) underneath and connected to the top metallization layer 2, the carrier wafer being designed for controlling a plurality of ICs which are to be bonded to the carrier wafer. The metallization layer 2 comprises metal lines 4 or contact areas 5, such as copper lines or contact areas. The dielectric layer 3 may be any suitable material, for example a stack of silicon carbide and silicon oxide.

A resist layer 6 is deposited onto the dielectric layer 3 and patterned to form openings 7 through the resist layer 6 (FIG. 1b), i.e. exposing the dielectric layer 3 at the bottom of the openings 7. The openings 7 are positioned above contact areas 5 of the top metallization layer 2. The openings 7 are formed by lithography, i.e. exposing the resist to a light source through a mask, developing the resist and removing it from the openings, which is a process known as such in the art. The type of resist and the lithography parameters are chosen so that the openings 7 have substantially vertical side-walls (when the surface of the dielectric layer 3 is regarded as the horizontal direction). No heat treatment performed to round off the sidewalls is necessary.

Figure 1C:
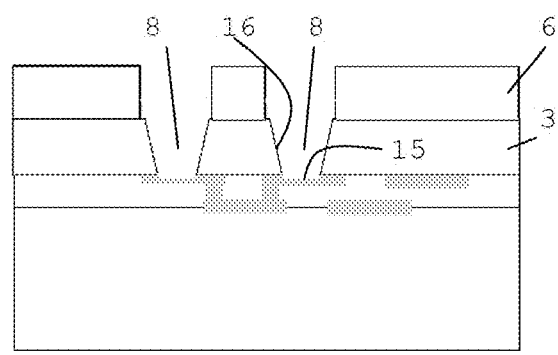
Figure 1D:
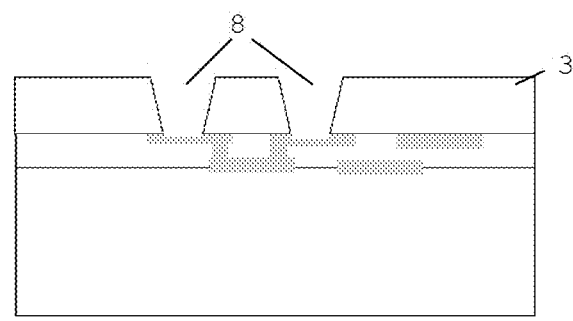
Figure 2:
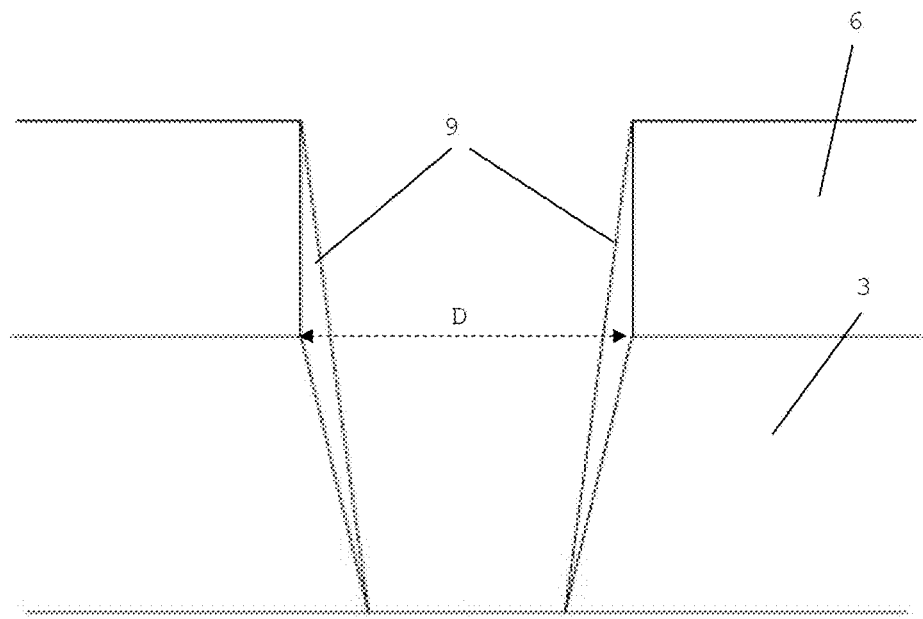
FIG. 2 shows example sidewalls of openings formed in a dielectric layer.

The substrate 1 is then subjected to plasma etching, to thereby produce openings 8 in the dielectric layer 3, until the contact areas 5 are exposed (FIG. 1c). The openings 8 have a substantially circular bottom area 15 and sloped sidewalls 16 forming a conical circumferential area. The plasma parameters and type of resist layer 6 material are selected so that during plasma etching, polymerisation takes place, and a polymer layer is formed, covering the side walls of the openings 7 in the resist layer 6 and progressively covering the sidewalls of the openings 8 in the dielectric layer 3, as the openings 8 are being etched. This polymer layer 9 is shown in the detail of FIG. 2 which shows only the dielectric layer 3 and the resist layer 6. The polymerisation takes place due to reactive species resulting from the etching process which react with components at the surface of the resist layer 6, to form polymers which in turn deposit on the sidewalls. This is a known side-effect from the plasma etch which is usually not beneficial as it causes the sidewalls of the etched openings to have a sloped orientation. In the present disclosure however, sloped sidewalls are included in the openings 8, and it is possible to control the slope of these openings 8 by selecting the plasma etch conditions, in combination with the application of substantially vertical sidewalls of the openings 7 in the resist, and with a suitable selection of the resist type.

According to an embodiment, a plating resist is used. According to another embodiment, a DNQ type resist is used (DNQ=Diazo Naphto Quinone). According to a further embodiment, a resist is used that does not belong to the so-called "High etch rate resistant" resist types, which comprise specific additives that prevent the formation of polymer-forming components in the resist. An example of a resist type that is suitable for use in the method of the disclosure is the AZ®10XT resist from AZ Electronic Materials.

The thickness of the resist layer is preferably lower than 15 µm, more preferably between 5 µm and 10 µm. Larger resist thicknesses may pose a problem as it becomes difficult to control the slope of the sidewalls of the dielectric layer 3 during the subsequent plasma etch. Also, when the resist thickness is too large, the production of excess polymer formation on the dielectric surface of the side-walls may lead to an etch-stop (the full thickness of the dielectric layer 3 may not be etched). Smaller resist thicknesses are not excluded from the scope of the disclosure, but are generally difficult to apply using existing techniques, such as a spin-on technique applicable in the case of AZ®10XT, which is typically applicable in layer thicknesses ranging between 5 µm and 18 µm.

The resist type and plasma etch parameters may furthermore be chosen so that no (or little) outgassing occurs during the plasma etch, i.e. no gases are released from the resist, as the gasses would otherwise interfere with the etching process and would deteriorate the controllability of the sloped surfaces. This condition (no outgassing) can be achieved with an appropriate choice of the plasma power applied during the etching step, as illustrated further in the example.

When the above conditions have been met, notably the openings 7 in the resist layer have substantially vertical sidewalls, the openings 8 in the dielectric layer 3 are produced by plasma etching, the resist material and the plasma process are configured so that substantially or essentially no outgassing occurs during the formation of the openings 8 in the dielectric layer 3, the resist type and plasma process are configured so as to form a polymer layer 9 on the sidewalls of the resist openings 7 and on the sidewalls of the openings 8 formed by the plasma etch, the openings 8 are formed with sloped sidewalls, the slope of the walls being substantially or essentially pre-defined. In other words, the slope of the openings 8 is controlled during the etching process. As seen in FIG. 2, the polymerisation furthermore ensures that the top diameter D of the openings 8 is substantially or essentially equal to the diameter of the resist openings 7, i.e. no or little widening of the holes takes place, so that the openings 8 can be placed closer together compared to holes produced with the standard techniques referred to above. As the openings 8 are not necessarily circular in cross section, it can be more generally that the upper cross-section of the openings 8 in the dielectric is substantially or essentially equal to the cross-section of the openings 7 in the resist. Preferably, the etching of the openings 8 takes place in a single etching step.

Figure 1E:
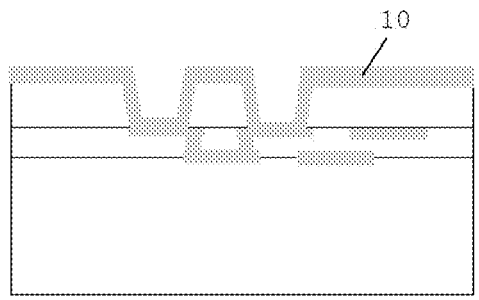

In the next step (FIG. 1*d*), the resist layer 6 and the polymer layer 9 are stripped, for example by a dry etching process known as such in the art, and a metal layer 10 is conformally deposited on the upper surface of the dielectric layer 3 and on the bottom and side walls of the openings 8 (FIG. 1*e*). The metal layer 10 may for example be obtained by deposition of tantalum and copper by subsequent PVD (Physical Vapour Deposition) steps to form a copper seed layer, followed by a copper plating step.

Figure 1F:
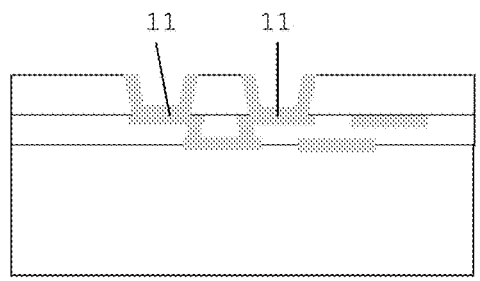

Finally and according to the preferred embodiment illustrated in the drawings, a CMP (Chemical Mechanical Polishing) step is performed (FIG. 1*e*), to remove the metal layer 10 from the surface of the dielectric layer 3, leaving only a metal layer on the bottom and on the sloped sidewalls of the openings 8, where they form hollow contact areas 11, electrically connected to the underlying metallization layers (FIG. 1*f*). The CMP step is performed to the effect that the metal layer 10 is completely removed from the upper surface of the dielectric layer 3, and preferably until also a top portion of the dielectric layer 3 itself is removed, so as to ensure that the contact areas 11 are electrically isolated from each other. The CMP can take place according to known CMP technology (see the example for suitable CMP parameters). This itself was not a self-evident point, given that CMP had not been used for this particular application, i.e. the planarizing of an array of cavities filled with a metal layer, in order to isolate these cavities from each other. It is possible to perform CMP without affecting the metal layer in the contact areas 11. The CMP step is followed by a standard cleaning step to remove all remaining loose particles from the surface after the CMP. Instead of the CMP step, the contact areas 11 may be isolated from each other by other suitable techniques, known as such in the art.

The present disclosure allows production of an array of hollow contact areas 11 (i.e. a pattern of possibly equal-sized contact areas) with a smaller pitch compared to arrays produced by other methods. This is true for the method in its broadest form, wherein the isolation of the contact areas is not necessarily done by CMP, because no or little widening of the openings 8 in the dielectric occurs due to the formation of the polymer layer 9. A further optimization of the pitch is due to the use of the CMP as all of the metal is removed from the top surface of the dielectric layer, the contact areas 11 can be placed closer together compared to the contact areas produced by other methods. According to a preferred embodiment, the pitch of an array of contact areas produced according to the disclosure is between 3 µm and 10 µm as opposed to at least 10 µm when applying other methods.

According to an embodiment, a solder layer (not shown) may be deposited on the metal layer 10 before or after the CMP step. For example a Sn layer may be deposited on the top Cu layer of metal layer 10 by an additional plating step before CMP, or by an electroless deposition step after CMP. When deposited after CMP, the Sn layer must be designed so that no or very little Sn is deposited on top of the edges of the openings 8. The Sn layer is helpful in establishing a strong bond between the contact areas and Cu contact structures (e.g. TSVs) on the other component, through the formation of Cu—Sn alloys.

Figure 3:
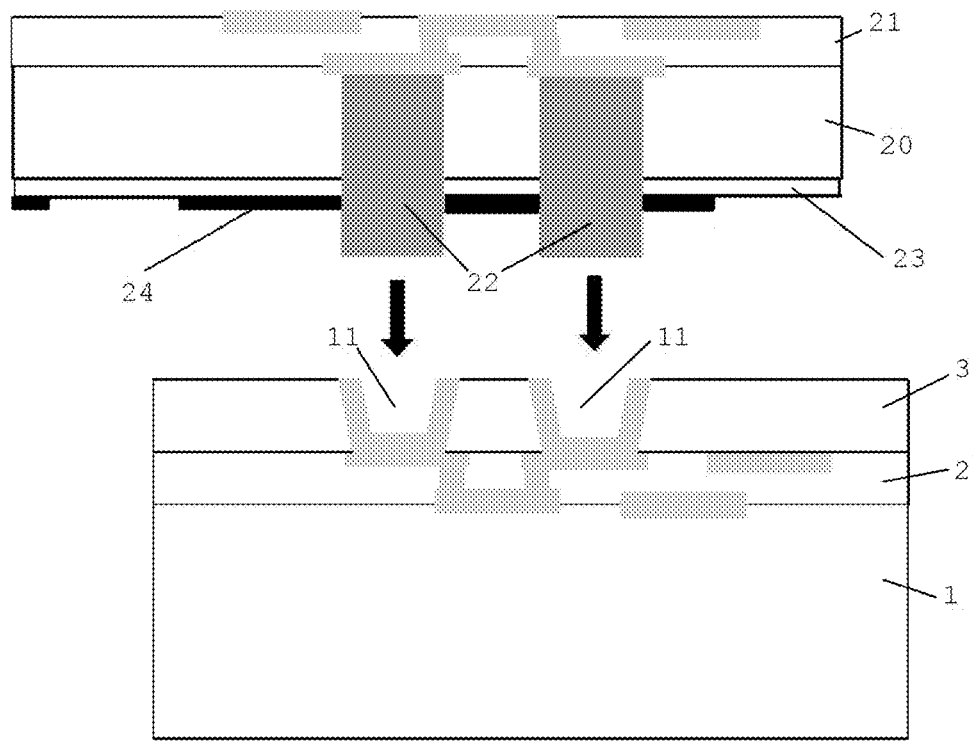
FIG. 3 shows an example of a component provided with TSVs suitable for being connected to contact areas produced according to the method of the disclosure.

FIG. 3 shows an example of another component that can be bonded to the contact areas 11 produced according to the method of the disclosure. This may be an integrated circuit comprising a Si-wafer 20, the wafer comprising a metallization layer 21, contacted by a set of copper TSVs 22, which extend outward from the surface opposite to the metallization layer. A dielectric layer 23 (e.g. SiN) surrounds the TSVs and isolates them from each other. Optionally a layer of adhesive 24 (e.g. BCB—Benzocyclobutene) is applied on parts of the surface for strengthening the bond between the components in areas where no TSV connections are present. The height of the TSVs extending outward from the surface is tuned to the depth of the contact areas 11 produced according to the disclosure.

The disclosure is also related to a semiconductor component, for example an integrated circuit or an interposer chip, provided with hollow contact areas 11 obtainable by the method according to the disclosure. As stated, one of the advantages of the method of the disclosure is that it allows production of sloped sidewalls so that the slope angle of the walls is substantially or essentially pre-defined, i.e. equal to a pre-defined value, for example 70°, within a very small error margin. When applied to the production of an array of hollow contact areas, the method is capable of producing such an array wherein the slope of the corresponding sidewalls of the openings is substantially or essentially the same, i.e. equal to each other within a very small error margin. For example the difference in the slope angle between any two contact areas in the array may be smaller than 2°, preferably smaller than 1°, more preferably smaller than 0.5°.

As stated also, the method of the disclosure, especially when it includes a CMP step, allows production of an array of contact areas 11 with a smaller pitch than compared to other methods. The disclosure is thus related to a component provided with such an array, having a pitch between 3 µm and 10 µm.

When the CMP step is included, a component can be produced with an array of hollow contact areas 11 formed in a plane dielectric layer, the bottom and sloped sidewalls of the openings being lined with a metal layer, but wherein no metal is present on the upper surface of the dielectric layer. The disclosure is also related to such a component.

Finally, the disclosure is related to a package comprising a first component comprising an array of hollow contact areas 11 as described in any one of the previous three paragraphs, and a second component bonded to the first component, the second component provided with contact structures bonded to the contact areas by insertion bonding. The contact structures may be copper TSVs or bumps.

Hereafter an example is given of a suitable set of process parameters for performing the method of the disclosure. Dielectric layer 3 may be a layer of $SiO_2$ of 6 μm thickness, applied on the upper metallization layer 2, by Chemical Vapour Deposition (CVD). A 7 μm thick layer of AZ®10X is applied by spinning on the $SiO_2$ layer and lithography is performed to produce the openings 7 in the resist layer 6. Litho parameters include an exposure energy of 1600 mJ and focus of −3 μm. The focus of −3 μm is preferred above the standard zero focus setting, for obtaining substantially vertical side walls.

Plasma etch is performed in a plasma etch tool, equipped with a plasma chamber between two electrodes, means for supplying plasma gas to the chamber, and two RF power sources, operating respectively at 2 MHz and 27 MHz. The following conditions were met in the example: a pressure in the chamber of 55 mTorr, a temperature of 20° C., 0 W of 2 MHz RF power, 1000 W of 27 MHz RF power, an atmosphere consisting of Ar, $O_2$ and $C_4F_6$, an Ar flow of 200 sccm (Standard Cubic Centimeter per minute, standard referring to 0° C. and 1 atm), an $O_2$ flow of 14.5 sccm, a $C_4F_6$ flow of 14 sccm, and an etch time of 1800 s.

The resist layer 6 and formed polymer layer 9 are stripped in two subsequent strip steps, performed in the same process chamber as the etch step. A first step includes a pressure of 350 mTorr, a temperature of 20° C., a 2 MHz power of 0 W, a 27 MHz power of 1000 W, an atmosphere including $O_2$ and $CF_4$ (2000 sccm $O_2$, 200 sccm $CF_4$), and a time of 300 s.

A second step includes a pressure of 350 mTorr, a temperature of 20° C., a 2 MHz power of 0 W, a 27 MHz power of 650 W, an atmosphere of $O_2$ (2000 sccm O2), and a time of 600 s.

Figure 4:
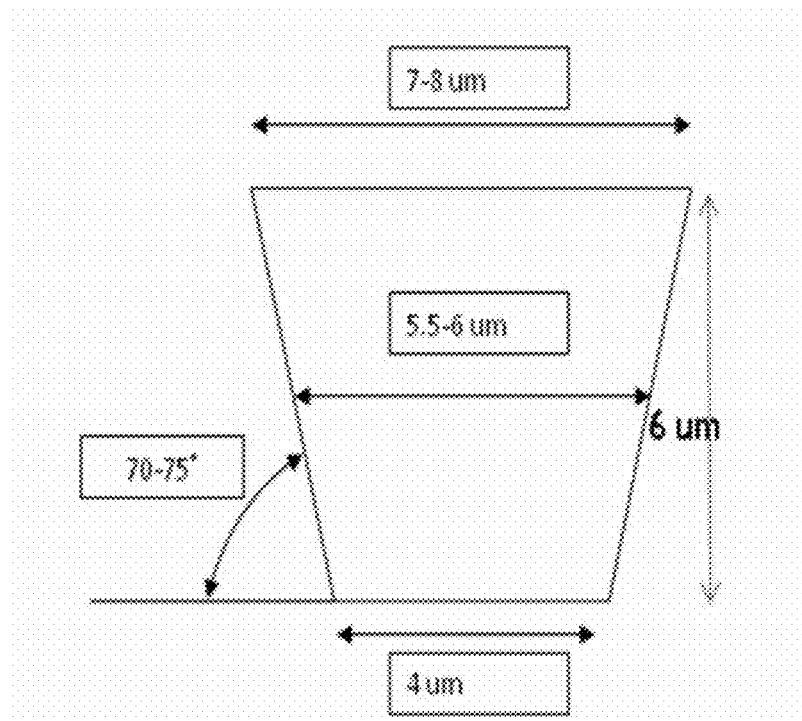
FIG. 4 shows an example of pre-defined dimensions of a contact area that can be produced by the method of the disclosure.

Finally, a rinsing is done in a 0.5% HF solution at 25° C. resulting in a set of well-defined openings 8 with dimensions as illustrated in FIG. 4 (dimension 'um' is to be read as micrometer, i.e. μm).

Then a copper seed layer is deposited by PVD. The seed layer consists of a Ta layer of about 15 nm thick and a Cu-layer with a thickness between 600 nm and 800 nm. This is followed by electro-deposition of a copper layer of between 250 nm and 1 μm thick, forming the metal layer 10 of FIG. 1e.

Finally, the CMP step is performed with following parameters: a first step includes a platen 1 polish process, Cu bulk removal on endpoint, a pressure of 2.62 psi with an R&H®RL3100 slurry with a slurry rate of 400 ml/min for a maximum time of 500 s.

A second step includes a platen 2 polish process, Cu clear, which consists of a main polish step on end point and an over-polish using the RL3100 slurry, a pressure of 1.5 psi and a slurry rate of 300 ml/min for a maximum time of 100 s.

A third step includes a platen 3 polish process, barrier clear and over-polish, a pressure of 0.8 psi and a slurry rate of 200 ml/min. The slurry used may be Dow® ACuplane™6325 slurry with polish time of 20 s, followed by a BTA (Benzotriazole) rinse step to avoid corrosion.

A fourth step may include a standard post-CMP clean in an integrated Desica® cleaner.

Variations on the above parameters are possible depending on the type and thickness of the resist. Some general indications are a limitation of the low-frequency power during the plasma etch, in order to avoid heavy bombardment of the resist with ions which may cause outgassing. The 2 MHz power is preferably not higher than 100 W. The pressure in the chamber should not be too high, and preferably remains below 80 mTorr. Above this power value, the top edges of the openings 8 may become more rounded.

According to a second aspect of the disclosure, the dielectric layer 3 in FIG. 1a is a photo-sensitive polymer layer, instead of an oxide layer as in the previous example. The photosensitive polymer layer is patterned by exposure through a photo mask followed by development of the exposed portion (or of the non-exposed portion depending on the type of photosensitivity), to form openings with sloped sidewalls through the complete thickness of the polymer layer. The photolithographic process is tailored to produce specific side wall angles. According to one embodiment, the focal plane of the stepper during exposure of the polymer layer through the mask is placed below or above the polymer layer (depending on whether the photosensitive polymer is a positive developing or a negative developing polymer respectively) so as to obtain a conical surface with a predefined slope angle.

In addition to this, the development process itself could be tailored so that material is removed faster from the openings during the start of the development process than at the end, so as to obtain a rounding off of the openings' sidewalls at the top of the openings and a further increase of the slope angle in the middle portion of the sidewalls. The rounded-off portion may then be removed afterward by CMP.

After producing the openings in this way, the polymer layer is cured. Then, the surface of the substrate is metalized by a thin conductive film, realizing electrical contacts at the bottom of the dielectric holes. The metal may be e.g. deposited by a combination of physical vapor deposition, electroless deposition or electrolytic deposition, for example in the manner described above in the detailed example.

After depositing this layer, CMP can be used to reduce the surface metallization. Unless otherwise indicated, all statements about the CMP step with regard to the first aspect of the disclosure are also applicable to the second aspect of the disclosure. The CMP can be chosen to be selective to the polymer dielectric layer 3. If the CMP is not selective to the polymer layer, a top portion of the polymer layer may be removed by the CMP (for example in order to remove the rounded-off portions referred to above). A similar set of CMP steps may be applied as in the above described example, but with the slurry and CMP parameters adapted for use on a polymer layer. After this CMP process, only the inside surface of the openings in the polymer layer is metalized and all connection pits are isolated from one another, as described in the above-described process flow.

Suitable examples of photosensitive polymers that are can be used are shown in the following table:

| | Polymer commercial name | | |
|---|---|---|---|
| | 8023-10 | AL-X2030 | CA-6001B |
| Chemistry base | Epoxy | Fluoro polymer | Phenol |
| Supplier | Dow Corning | AGC | Hitachi |

The curing of the polymer may take place in a curing process applying suitable parameters for the type of polymer involved.

Like the first aspect, the second aspect of the present disclosure allows to produce an array of hollow contact areas (i.e. a regular pattern of equal-sized contact areas) with a smaller pitch compared to arrays produced by presently existing methods. A further optimization of the pitch is due to the use of the CMP: as all of the metal is removed from the top surface of the photosensitive polymer layer, the contact areas can be placed closer together compared to the contact areas produced by presently known methods. According to a preferred embodiment of the second aspect, the pitch of an array of contact areas produced according to the disclosure is between 3 and 10 µm as opposed to at least 10 µm when applying the prior art methods.

According to an embodiment of the second aspect, a solder layer (not shown) may be deposited on the metal layer before or after the CMP step. For example a Sn layer may be deposited on a top Cu layer of the metal layer by an additional plating step before CMP, or by an electroless deposition step after CMP. When deposited after CMP, the Sn layer must be designed so that no or very little Sn is deposited on top of the edges of the holes. The Sn layer is helpful in establishing a strong bond between the contact areas and Cu contact structures (e.g. TSVs) on the other component, through the formation of Cu—Sn alloys.

The disclosure is also related to a semiconductor component, for example an integrated circuit or an interposer chip, provided with hollow contact areas 11 obtainable by the method according to the second aspect of the disclosure. As for the first aspect, one of the advantages of the method of the disclosure according to the second aspect is that it allows to produce the sloped sidewalls so that the slope angle of said walls is substantially pre-defined, i.e. equal to a pre-defined value, for example 70°, within a very small error margin. When applied to the production of an array of hollow contact areas, the method is thus capable of producing such an array wherein the slope of the corresponding sidewalls of all the openings is substantially the same, i.e. equal to each other within a very small error margin. For example the difference in the slope angle between any two contact areas in the array is smaller than 2°, preferably smaller than 1°, more preferably smaller than 0.5°.

As stated also, the method of the second aspect of the disclosure, especially when it includes a CMP step, allows to produce an array of contact areas 11 with a smaller pitch than compared to the prior art. The disclosure is thus related to a component provided with such an array, having a pitch between 3 and 10 µm.

When the CMP step is included in the method according to the second aspect, a component can be produced with an array of hollow contact areas formed in a plane dielectric layer, the bottom and sloped sidewalls of the openings being lined with a metal layer, but wherein no metal is present on the upper surface of the dielectric layer. The disclosure is also related to such a component.

Finally, the second aspect of the disclosure is related to a package comprising a first component comprising an array of hollow contact areas as described in any one of the previous three paragraphs, and a second component bonded to the first component, the second component provided with contact structures bonded to said contact areas by insertion bonding. Said contact structures may be copper TSVs or bumps.

While the disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The foregoing description details certain embodiments of the disclosure. It will be appreciated, however, that no matter how detailed the foregoing appears in text, the disclosure may be practiced in many ways, and is therefore not limited to the embodiments disclosed. It should be noted that the use of particular terminology when describing certain features or aspects of the disclosure should not be taken to imply that the terminology is being re-defined herein to be restricted to include any specific characteristics of the features or aspects of the disclosure with which that terminology is associated.

Unless specifically specified, the description of a layer being deposited or produced 'on' another layer or substrate, includes the options of the layer being produced or deposited directly on, i.e. in contact with, the other layer or substrate, and the layer being produced on one or a stack of intermediate layers between the layer and the other layer or substrate.

In the figures, similar symbols typically identify similar components, unless context indicates otherwise. The illustrative embodiments described in the detailed description, figures, and claims are not meant to be limiting. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

The invention claimed is:

1. A method for producing contact areas on a semiconductor component comprising a stack of one or more metallization layers on a semiconductor substrate, the method comprising:
   depositing a dielectric layer on and in contact with one or more metal areas of an upper metallization layer of the stack, the deposited dielectric layer forming a flat upper surface of the dielectric layer;
   depositing a resist layer on and in contact with the flat upper surface of the dielectric layer;
   producing one or more openings in the resist layer, the one or more openings being located respectively above the one or more metal areas, thereby exposing areas of the flat upper surface of the dielectric layer, wherein the one or more openings in the resist layer have substantially vertical sidewalls;
   removing, via a plasma etching process, the dielectric layer above the one or more metal areas, thereby forming one or more openings in the dielectric layer and exposing at one or more bottoms of the one or more openings in the dielectric layer at least portions of the one or more metal areas;
   while removing the dielectric layer above the one or more metal areas, controllably forming a polymer layer based on a pre-defined sidewall slope, wherein the polymer layer is formed on the sidewalls of the one or more openings in the resist layer and on sidewalls of the one or more openings in the dielectric layer, wherein the formation of the polymer layer causes a slope of the sidewalls of the one or more openings in the dielectric layer to be substantially equal to the pre-defined sidewall slope, stripping the resist layer and removing the polymer layer from the sidewalls of the one or more openings in the dielectric layer;

depositing a metal layer conformally on the flat upper surface of the dielectric layer and in the one or more openings in the dielectric layer; and completely removing, via chemical mechanical polishing (CMP), the metal layer from the flat upper surface of the dielectric layer, respective portions of the metal layer remaining on bottom and side walls of the one or more openings in the dielectric layer such that the one or more openings in the dielectric layer are configured to receive respective one or more metal contacts by insertion into the one or more openings in the dielectric layer, wherein the resist layer and the plasma etching process are configured so that substantially no outgassing occurs during formation of the one or more openings in the dielectric layer.

2. The method of claim 1, wherein the resist layer is a plating resist layer.

3. The method of claim 1, wherein the resist layer is a diazo naphto quinone (DNQ) resist layer.

4. The method of claim 1, wherein an upper cross section of the one or more openings in the dielectric layer obtained after stripping the resist layer and the polymer layer is substantially equal to a cross section of the one or more openings in the resist layer.

5. The method of claim 1, wherein a thickness of the resist layer is at least 5 μm.

6. The method of claim 1, wherein at least a portion of the one or more openings in the dielectric layer are produced as an array of openings with a pitch between 3 and 10 μm.

7. The method of claim 1, further comprising depositing a solder material on the metal layer in the one or more openings in the dielectric layer.

8. A method for producing contact areas on a semiconductor component comprising a stack of one or more metallization layers on a semiconductor substrate, the method comprising:

depositing a dielectric layer on and in contact with two or more metal areas of an upper metallization layer of the stack, the deposited dielectric layer forming a flat upper surface of the dielectric layer;

depositing a resist layer on and in contact with the flat upper surface of the dielectric layer;

producing two or more openings in the resist layer, the two or more openings being located respectively above the two or more metal areas, thereby exposing areas of the flat upper surface of the dielectric layer, wherein the two or more openings in the resist layer have substantially vertical sidewalls;

removing, via a plasma etching process, the dielectric layer above the two or more metal areas, thereby forming two or more openings in the dielectric layer and exposing at two or more bottoms of the two or more openings in the dielectric layer at least portions of the two or more metal areas;

while removing the dielectric layer above the two or more metal areas, controllably forming a polymer layer based on a pre-defined sidewall slope, wherein the polymer layer is formed on the sidewalls of the two or more openings in the resist layer and on sidewalls of the two or more openings in the dielectric layer, wherein the formation of the polymer layer causes a slope of the sidewalls of the two or more openings in the dielectric layer to be substantially equal to the pre-defined sidewall slope, stripping the resist layer and removing the polymer layer from the sidewalls of the two or more openings in the dielectric layer;

depositing a metal layer conformally on the flat upper surface of the dielectric layer and in the two or more openings in the dielectric layer; and completely removing, via chemical mechanical polishing (CMP), the metal layer from the flat upper surface of the dielectric layer, respective portions of the metal layer remaining on bottom and side walls of the two or more openings in the dielectric layer such that the two or more openings in the dielectric layer are configured to receive respective two or more metal contacts by insertion into the two or more openings in the dielectric layer, thereby electrically isolating each portion of the respective portions of the metal layer from each other portion of the respective portions of the metal layer, wherein the resist layer and the plasma etching process are configured so that substantially no outgassing occurs during formation of the two or more openings in the dielectric layer.

9. The method of claim 8, wherein the resist layer is a plating resist layer.

10. The method of claim 8, wherein the resist layer is a diazo naphto quinone (DNQ) resist layer.

11. The method of claim 8, wherein an upper cross section of the two or more openings in the dielectric layer obtained after stripping the resist layer and the polymer layer is substantially equal to a cross section of the two or more openings in the resist layer.

12. The method of claim 8, wherein a thickness of the resist layer is at least 5 μm.

13. The method of claim 8, wherein at least a portion of the two or more openings in the dielectric layer are produced as an array of openings with a pitch between 3 and 10 μm.

14. The method of claim 8, further comprising depositing a solder material on the metal layer in the two or more openings in the dielectric layer.

* * * * *